United States Patent
Tsuda et al.

(10) Patent No.: US 11,657,944 B2
(45) Date of Patent: May 23, 2023

(54) FLEXIBLE PRINTED CIRCUIT BOARD AND IMAGE STABILIZATION MODULE

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yukie Tsuda, Osaka (JP); Yuichi Nakamura, Osaka (JP); Masanao Yamashita, Osaka (JP); Koji Nitta, Osaka (JP); Kou Noguchi, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 17/627,887

(22) PCT Filed: Mar. 24, 2021

(86) PCT No.: PCT/JP2021/012407
§ 371 (c)(1),
(2) Date: Jan. 18, 2022

(87) PCT Pub. No.: WO2021/193771
PCT Pub. Date: Sep. 30, 2021

(65) Prior Publication Data
US 2022/0208428 A1    Jun. 30, 2022

(30) Foreign Application Priority Data
Mar. 27, 2020 (JP) .............................. JP2020-059088

(51) Int. Cl.
*H01F 7/20* (2006.01)
*H05K 1/02* (2006.01)
*H01F 27/06* (2006.01)
*H01F 7/02* (2006.01)
*G02B 27/64* (2006.01)

(52) U.S. Cl.
CPC ................. *H01F 7/20* (2013.01); *H01F 7/02* (2013.01); *H01F 27/06* (2013.01); *H05K 1/028* (2013.01);
(Continued)

(58) Field of Classification Search
CPC ... H01F 7/20; H01F 7/02; H01F 27/06; H01F 2027/065; H05K 1/028; H05K 2201/08; G02B 27/646
See application file for complete search history.

(56) References Cited

U.S. PATENT DOCUMENTS 5,032,810 A    7/1991  Kaneko et al.
9,177,709 B2 *  11/2015  Parthasarathy ..... H01F 17/0013
(Continued)

FOREIGN PATENT DOCUMENTS

CN    1350310    5/2002
CN    1577645    2/2005
(Continued)

OTHER PUBLICATIONS

Machine translation of Ueda, Kazuhiko (CN1577645A), Feb. 9, 2005 (Year: 2005).*

*Primary Examiner* — Bernard Rojas
(74) *Attorney, Agent, or Firm* — IPUSA, PLLC

(57) ABSTRACT

A flexible printed circuit board according to the present disclosures includes a base film having an insulating property, and a planar coil disposed on a surface of the base film, wherein a number of turns on an inside of a center point of a coil width of the planar coil in a plan view is greater than a number of turns on an outside of the center point.

6 Claims, 8 Drawing Sheets

(52) U.S. Cl.
CPC ...... *G02B 27/646* (2013.01); *H01F 2027/065* (2013.01); *H05K 2201/08* (2013.01)

(56) References Cited

U.S. PATENT DOCUMENTS

| | | | |
|---|---|---|---|
| 10,886,058 B2 * | 1/2021 | Cho | .......................... H03F 1/34 |
| 2002/0067235 A1 * | 6/2002 | Ueda | ................... H01F 17/0006 |
| | | | 336/200 |
| 2005/0046532 A1 * | 3/2005 | Dodd | ................... G01R 33/385 |
| | | | 335/299 |
| 2006/0017818 A1 | 1/2006 | Enomoto | |
| 2006/0018643 A1 * | 1/2006 | Stavely | ............... H04N 5/23287 |
| | | | 348/E5.046 |
| 2016/0012950 A1 | 1/2016 | Nishino et al. | |
| 2016/0049237 A1 * | 2/2016 | Yosui | ................... H01F 17/0013 |
| | | | 336/200 |
| 2017/0164483 A1 * | 6/2017 | Kouchi | ................... H05K 1/028 |
| 2017/0346342 A1 * | 11/2017 | Kim | ........................ H01F 38/14 |
| 2019/0394399 A1 * | 12/2019 | Abe | ........................ G03B 13/36 |

FOREIGN PATENT DOCUMENTS

| | | | | |
|---|---|---|---|---|
| EP | 2711946 A1 * | 3/2014 | ........... | H01F 27/006 |
| JP | S48-046810 | 7/1973 | | |
| JP | 2006-031027 | 2/2006 | | |
| JP | 2006-067562 | 3/2006 | | |
| JP | 2010-082501 | 4/2010 | | |
| JP | 2019-219564 | 12/2019 | | |
| WO | 2015/079773 | 6/2015 | | |

\* cited by examiner

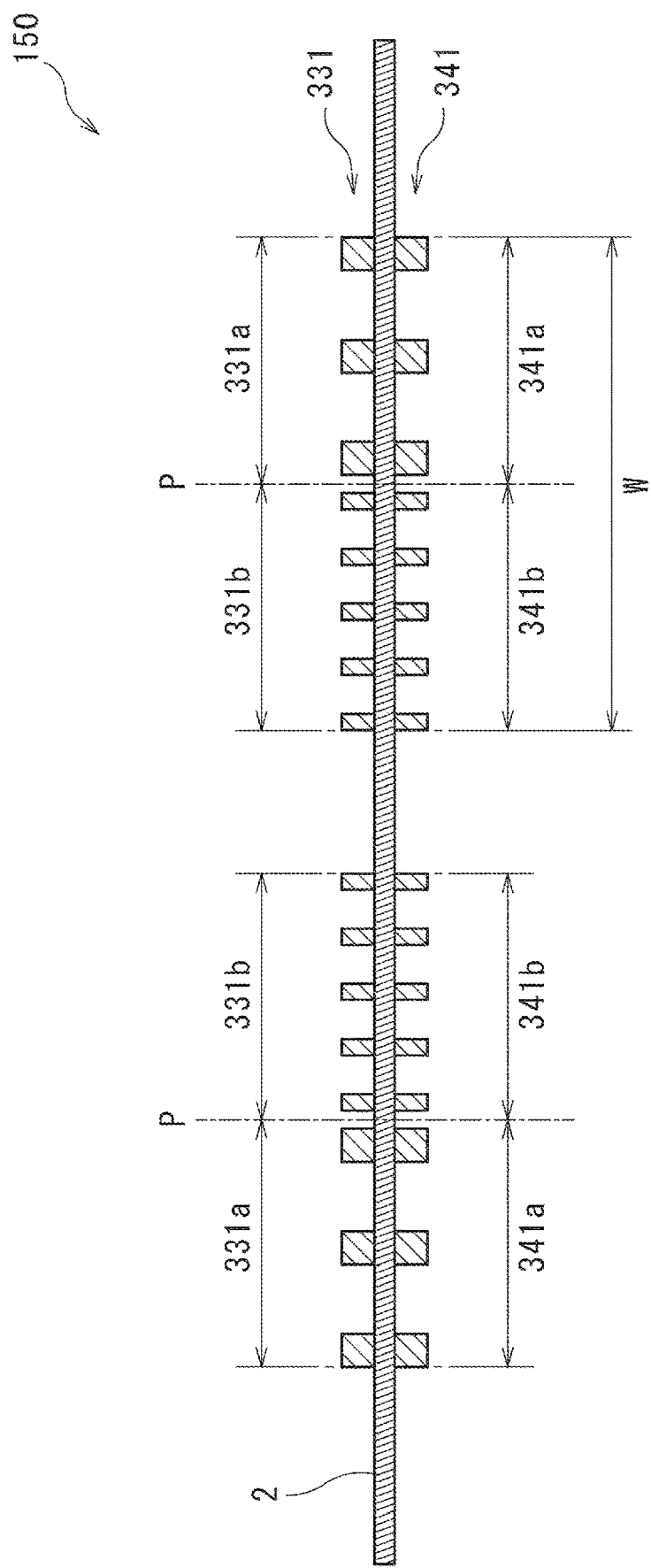

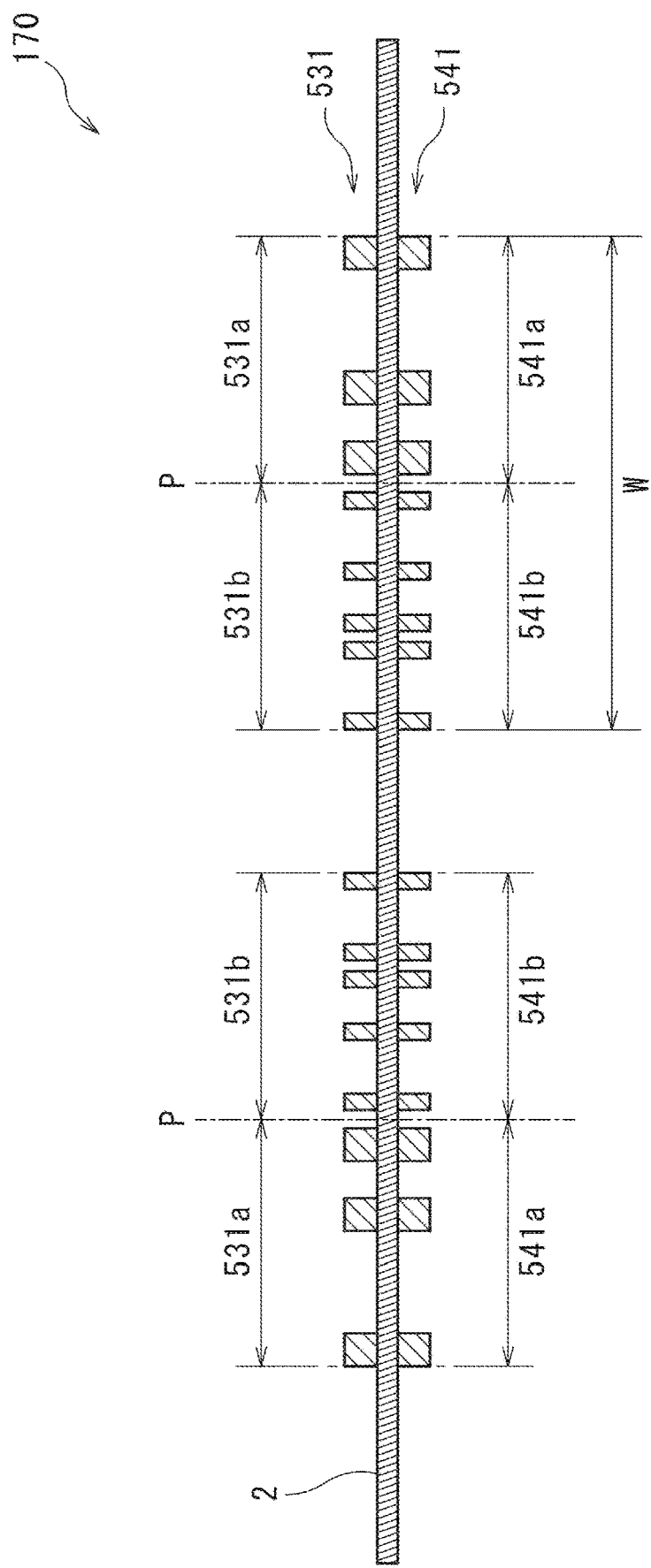

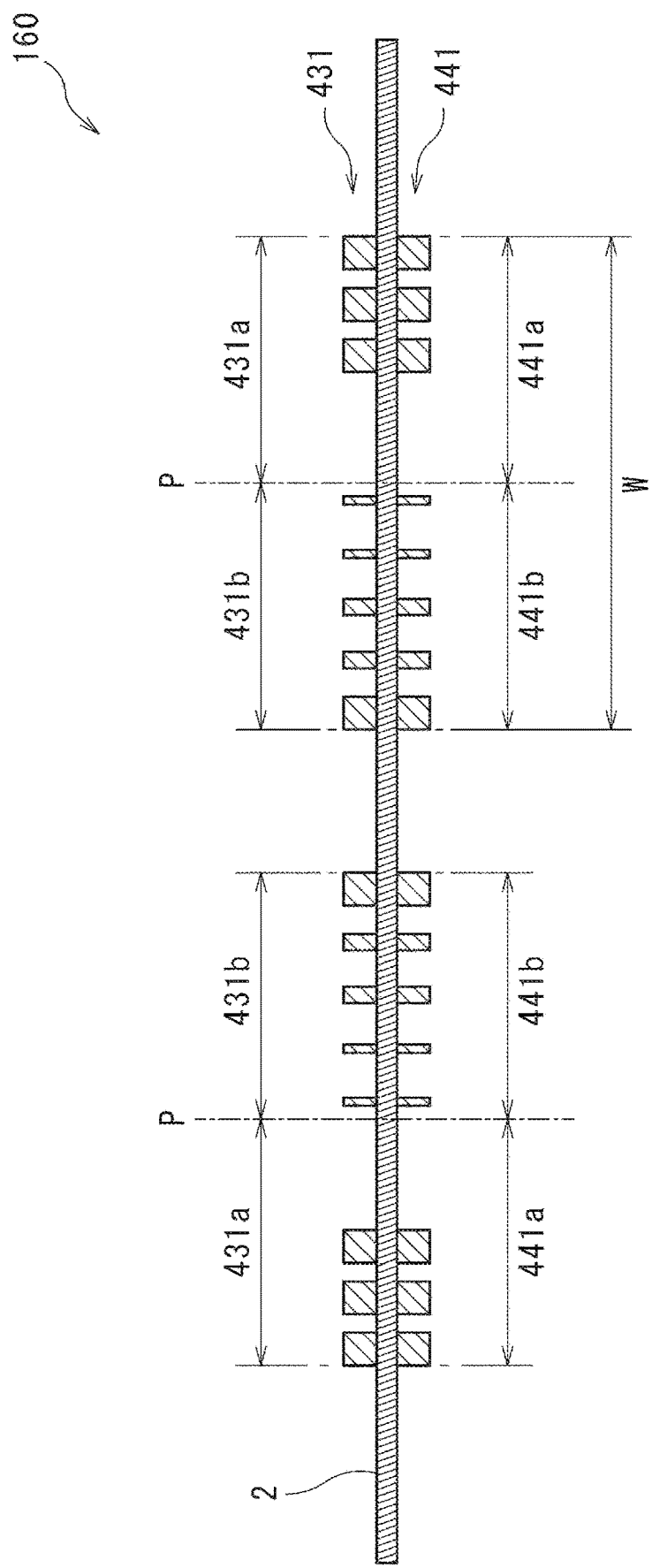

FLEXIBLE PRINTED CIRCUIT BOARD AND IMAGE STABILIZATION MODULE

TECHNICAL FIELD

The disclosures herein relate to flexible printed circuit boards and image stabilization modules.

The present application is based on and claims priority to Japanese patent application No. 2020-059088 filed on Mar. 27, 2020, and the entire contents of the Japanese patent application are hereby incorporated by reference.

BACKGROUND ART

Printed circuit boards are widely used to form circuits for various electronic devices. Patent Document 1, for example, discloses a camera image stabilization apparatus utilizing a printed circuit board on which two planar coils (X-direction drive coil and Y direction drive coil) having an oblong shape in a plan view are arranged perpendicularly to each other (see Japanese Laid-open Patent Publication No. 2006-67562).

RELATED-ART DOCUMENTS

Patent Document

[Patent Document 1] Japanese Laid-open Patent Publication No. 2006-67562

SUMMARY OF THE INVENTION

A flexible printed circuit board according to one aspect of the present disclosures includes a base film having an insulating property and a planar coil disposed on a surface of the base film, wherein a number of turns on an inside of a center point of a coil width of the planar coil in a plan view is greater than a number of turns on an outside of the center point.

BRIEF DESCRIPTION OF DRAWINGS

FIG. 7 is a cross-sectional view of a flexible printed circuit board according to a different embodiment.

FIG. 8 is a cross-sectional view of a flexible printed circuit board according to a different embodiment.

FIG. 9 is a cross-sectional view of a flexible printed circuit board according to a different embodiment.

MODE FOR CARRYING OUT THE INVENTION

Figure 1:
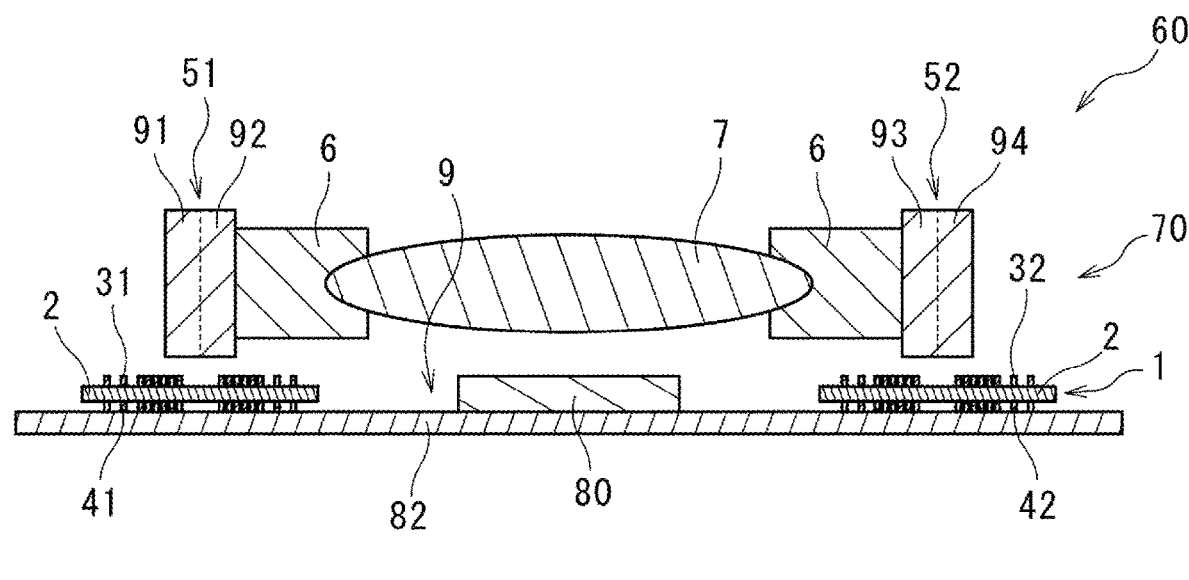
FIG. 1 is a schematic cross-sectional view illustrating an example of a camera image stabilization mechanism provided with an image stabilization module according to one embodiment of the present disclosures.

Problem to be Solved by the Present Disclosures

The related-art technology described above uses a method of obtaining information about the position of a coil plate by detecting a change in magnetic flux in the proximity of a border between the N pole and the S pole of a permanent magnet. For use in a camera image stabilization module, another method has also been studied that performs image stabilization by using a magnetic force exerted by a coil to drive an imaging device or a correction lens in the direction in which camera shake is canceled. In the case of the method noted above, however, the inventors of the present invention have found that when a coil winding density is constant in the coil, the magnetic force (Lorentz force) exerted by the coil varies depending on the positional relationship between a magnet and the coil upon a movement of the magnet. Improving the accuracy of image stabilization by a camera image stabilization module requires reducing the variation of Lorentz force occurring upon movement of a magnet.

The present disclosures are made in consideration of the above-noted circumstances, and are directed to providing a flexible printed circuit board that can reduce the variation of Lorentz force occurring upon movement of a magnet of an image stabilization module.

Advantage of the Present Disclosures

According to the flexible printed circuit board of the present disclosures, the variation of Lorentz force occurring upon movement of a magnet of an image stabilization module is reduced.

Description of Embodiments of the Present Disclosures

Embodiments of the present disclosures will be listed and described first.

A flexible printed circuit board according to one aspect of the present disclosures includes a base film having an insulating property, and a planar coil disposed on a surface of the base film, wherein a number of turns on an inside of a center point of a coil width of the planar coil in a plan view is greater than a number of turns on an outside of the center point.

In the case of a coil winding density being constant, the Lorentz force observed upon displacement of a magnet will be less than the Lorentz force observed when the magnet is positioned at the center of the coil. This is because the Lorentz force exerted by the coil is generated according to interaction between the coil winding density and the density of magnetic flux generated by the magnet. Accordingly, the density of turns is set relatively high in the peripheral area of the center portion of the coil where Lorentz force by the coil is easy to occur, while the density of turns is set relatively low in the outer side of the coil. This arrangement is found, by the inventors, to improve the Lorentz force generated by the coil and to reduce the variation of Lorentz force occurring upon displacement of the magnet, as long as in the peripheral area of the center portion of the coil. In the noted flexible printed circuit board, the planar coil disposed on the surface of the base film is configured such that the number of turns inside the center point of a coil width of the planar coil in a plan view is greater than the number of turns outside the center point. As a result, the noted flexible printed circuit board can reduce the variation of Lorentz force occurring upon movement of a magnet in the peripheral area of the center portion of the coil provided in an image stabilization module. The flexible printed circuit board thus provides highly accurate image stabilization when the range of shake stays within the predetermined peripheral area of the center portion because a stable Lorentz force is obtained regardless of a displacement of the magnet. Further, the flexible printed circuit board can improve its maximum Lorentz force, and can thus be used for a high-performance weighty optical configuration having a plurality of lenses and the like. Moreover, Lorentz force can be maintained by a relatively small electric current, compared with a conventional optical configuration having the same weight, which enables the reduction of power consumption. In the present application, the term "Lorentz force" means a drive force exerted in a straight-line direction based on a magnetic force.

The noted flexible printed circuit board is preferably such that the proportion of the number of turns on the inside in a total number of turns is greater than or equal to 55%. The fact that the proportion of the number of turns on the inside in a total number of turns is greater than or equal to 55% makes it possible to reduce the variation of Lorentz force occurring upon a movement of the magnet in the image stabilization module.

The average line width of the turns is preferably greater than or equal to 10 μm and less than or equal to 125 μm. The fact that the average line width of each turn is within the above-noted range allows the turns to be easily formed, and, also, makes it easy to set the thickness and density of turns within a desired range.

The ratio of the average line width of the turns on the outside to the average line width of the turns on the inside is preferably greater than or equal to 1 and less than or equal to 5. The fact that the ratio of the average line width of the turns on the outside to the average line width of the turns on the inside is within the above-noted range allows the turns to be easily formed, and, also, makes it easy to set the thickness and density of turns within a desired range.

The average intervals between adjacent turns among the turns on the inside are preferably equal. The fact that the average intervals between adjacent turns among the turns on the inside are equal makes it easy to form the planar coil.

The average intervals between adjacent turns among the turns on the inside preferably are different. The fact that the average intervals between adjacent turns among the turns on the inside are different makes it easy to adjust the density of the turns on the inside.

An image stabilization module according to another aspect of the present disclosures includes the noted flexible printed circuit board and a permanent magnet.

The image stabilization module is provided with the noted flexible printed circuit board, so that the variation of Lorentz force occurring upon a movement of a magnet of the image stabilization module is reduced. The image stabilization module can thus improve the accuracy of camera image stabilization.

Details of Embodiments of the Present Disclosures

In the following, embodiments of the flexible printed circuit board and the image stabilization module according to the present disclosures will be described with reference to the drawings. With respect to the "front/back" side of the flexible printed circuit board of the present embodiment, the side of the flexible printed circuit board in the thickness direction where a correction lens is disposed is designated as the "front" side, and the opposite side of the flexible printed circuit board from where the correction lens is disposed is designated as the "back" side. The "front/back" side of the flexible printed circuit board as determined by conditions during use is not intended.

[Camera Image Stabilization Mechanism]

Figure 2:
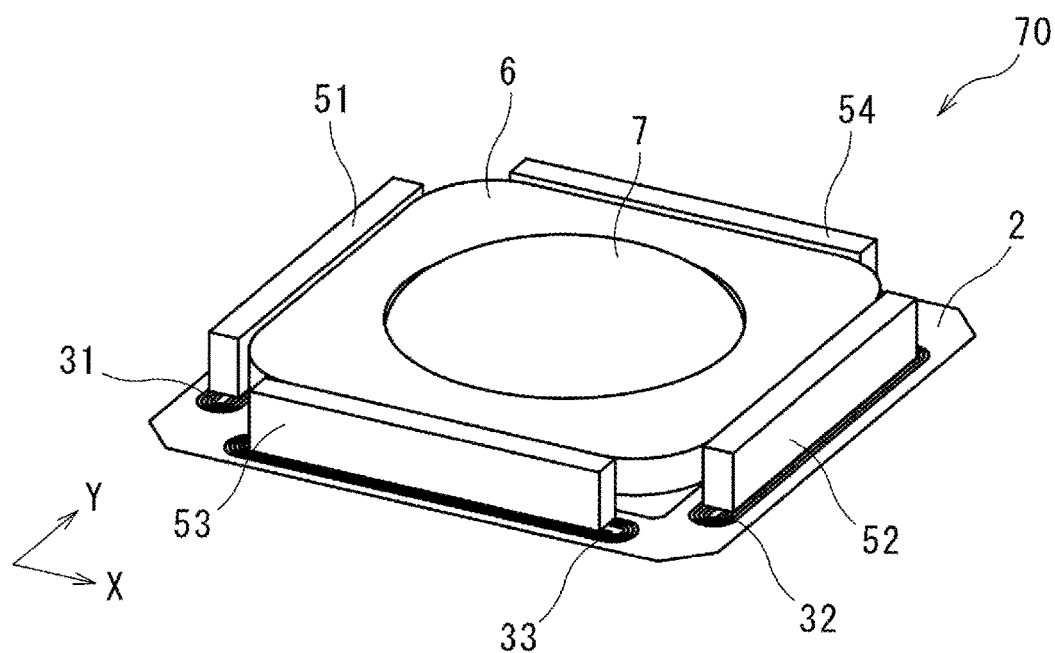
FIG. 2 is a schematic axonometric view illustrating the image stabilization module according to the embodiment of the present disclosures.
Figure 3:
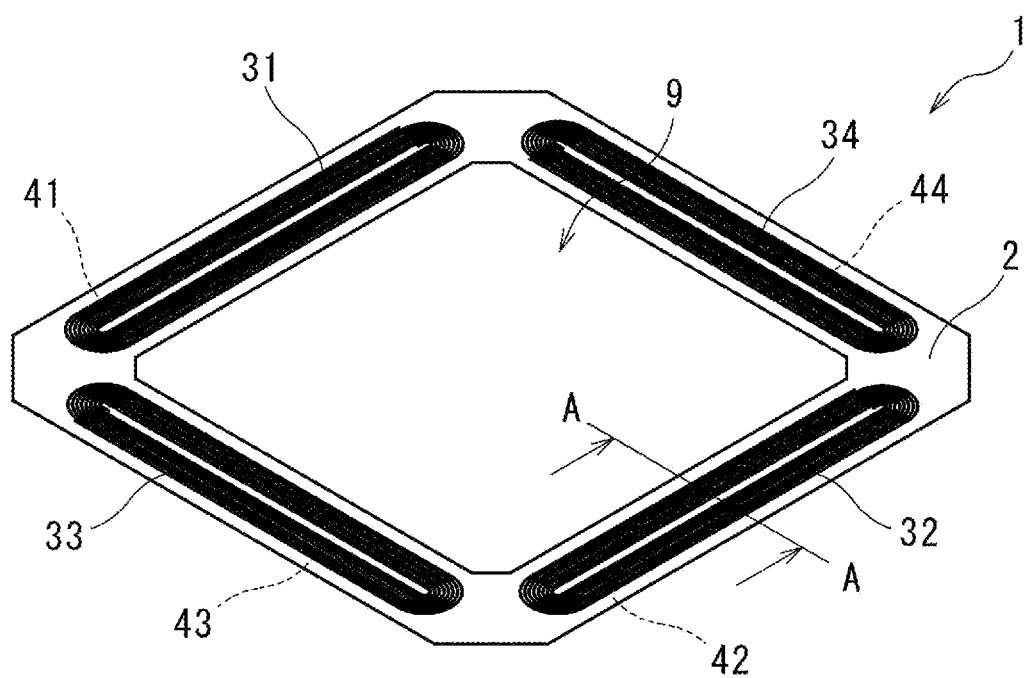
FIG. 3 is a schematic axonometric view illustrating a flexible printed circuit board according to the embodiment of the present disclosures.

FIG. 1 is a schematic cross-sectional view illustrating an example of a camera image stabilization mechanism provided with an image stabilization module according to one embodiment of the present disclosures. FIG. 2 is a schematic axonometric view illustrating the image stabilization module according to the embodiment of the present disclosures. FIG. 3 is a schematic axonometric view illustrating a flexible printed circuit board according to the embodiment of the present disclosures. An image stabilization mechanism 60 embedded in digital cameras, smartphones, and the like has an image stabilization module 70 that is arranged perpendicularly to an optical axis between an unshown optical system and an imaging device 80. The image stabilization module 70 is provided with a flexible printed circuit board 1 according to the embodiment of the present disclosures, and correct the blurring of an image of a photography subject resulting from camera shake. In the image stabilization mechanism 60, the imaging device 80 implemented as an image sensor such as a CCD (charge-coupled device) is secured on a substrate 82 to face a correction lens 7. The imaging device 80 takes and converts the image of a photography subject created by the optical system into electrical signals.

As illustrated in FIG. 3, planar coils 31, 32, 33, and 34 are laminated on the front surface of a base film 2, and unshown planar coils 41, 42, 43, and 44 are laminated on the back surface of the base film 2. The substrate 82 of FIG. 1 has an insulating layer (not shown) laminated thereon to prevent damage and short-circuit caused by contact of the planar coils 31, 32, 33, 34 and the planar coils 41, 42, 43, 44 with other members or the like. The insulating layer preferably covers all the exterior surface of the substrate 82, except for openings and cutouts that are intentionally provided. The insulating layer may be formed by use of a solder resist, a coverlay, or the like, and is preferably formed by curing a photosensitive dry film in particular.

<Image Stabilization Module>

The image stabilization module 70 includes the flexible printed circuit board 1 and permanent magnets 51, 52, 53, and 54.

The four permanent magnets 51, 52, 53, and 54 are disposed around a magnet holder 6. The magnet holder 6 supports the correction lens 7 at the center thereof. The permanent magnets 51, 52, 53, and 54 are spaced apart from each other in directions perpendicular to the optical axis of the unshown optical system. Also, the permanent magnets 51 and 52 are disposed in an opposing fashion, and so are the permanent magnets 53 and 54. The permanent magnets 51, 52, 53, and 54 are magnetized with the N pole and the S pole aligned in the directions perpendicular to the optical axis direction. In the permanent magnet 51 and the permanent magnet 52 of FIG. 1, the magnetic pole 92 of the permanent magnet 51 and the magnetic pole 93 of the permanent magnet 52 facing each other are the same. For example, the magnetic pole 92 and the magnetic pole 93 may be the N pole, in which case the magnetic pole 91 of the permanent magnet 51 and the magnetic pole 94 of the permanent magnet 52 are the S pole. Each strand of the planar coils 31, 32, 33, and 34 and the planar coils 41, 42, 43, and 44 is wound in a spiral shape in a plane parallel to the longitudinal directions of the permanent magnets 51, 52, 53, 54. The planar coils 31, 32, 33, and 34 and the planar coils 41, 42, 43, and 44 are disposed in an opposing relationship to the permanent magnets 51, 52, 53, 54, respectively, in a non-contact manner. The planar coils 31, 32, 33, and 34 and the planar coils 41, 42, 43, and 44 consistently stay within the magnetic fields of the four permanent magnets 51, 52, 53, 54, respectively.

Applying current to the planar coils 31, 32, 33, and 34 and the planar coils 41, 42, 43, and 44 causes interaction to occur between the magnetic fields of the permanent magnets 51, 52, 53, and 54 and the magnetic fields created by the currents flowing through the planar coils 31, 32, 33, and 34 and the planar coils 41, 42, 43, and 44. For example, applying current to the planar coils 31, 32, 33, and 34 and the planar coils 41, 42, 43, and 44 causes an electromagnetic force, i.e., a Lorentz force, to be generated by the planar coils 31, 32, 33, and 34 and the planar coils 41, 42, 43, and 44 in accordance with Fleming's left-hand rule. As a result, the permanent magnets 51, 52, 53, and 54 drive the correction lens 7 at the center of the magnet holder 6. The image stabilization module 70 uses the magnetic force exerted by the planar coils 31, 32, 33, and 34 and the planar coils 41, 42, 43, and 44 to drive the correction lens 7 in the direction in which camera shake is canceled, thereby performing image stabilization. In this manner, the image stabilization module 70 is provided with the noted flexible printed circuit board 1, so that the variation of Lorentz force occurring upon movement of the permanent magnets 51, 52, 53, and 54 of the image stabilization module 70 is reduced. The image stabilization module 70 can thus improve the accuracy of camera image stabilization.

<Flexible Printed Circuit Board>

The flexible printed circuit board 1 illustrated in FIG. 3 includes the flexible, insulating base film 2, and includes the planar coils 31, 32, 33, and 34, the planar coils 41, 42, 43, and 44, and the like provided on the front surface of the base film 2.

(Base Film)

The base film 2 is comprised mainly of synthetic resin, and is flexible and electrically insulating. The base film 2 is a substrate layer on which the planar coils 31, 32, 33, and 34, the planar coils 41, 42, 43, and 44, and the like are formed. The term "comprised mainly of" refers to a component accounting for the highest content on a weight basis, and may refer to a component with a content of 50 wt % or more, for example. The base film 2 has a square cutout 9, and has a square ring shape.

Examples of the above-noted synthetic resin include polyimide, polyethylene terephthalate, liquid crystal polymer, fluorine resin, and the like.

The lower limit of the average thickness of the base film 2 is preferably 5 μm and more preferably 10 μm. The upper limit of the average thickness of the base film 2 is preferably 50 μm and more preferably 40 μm. Use of an average thickness of the base film 2 that does not reach the lower limit may create a risk that the insulation strength of the base film 2 is insufficient. Use of an average thickness of the base film 2 that exceeds the upper limit may create a risk that the flexible printed circuit board 1 is unnecessarily thick, or is not sufficiently flexible. In the instant specification, the average thickness refers to the average value of thicknesses measured at any 10 selected points.

(Planar Coil)

As illustrated in FIG. 3, the base film 2 having a square ring shape has four pairs of planar coils, i.e., the planar coils 31, 32, 33, and 34 and the planar coils 41, 42, 43, and 44, laminated on the front surface and the back surface along the respective edges. The planar coils may alternatively be laminated only on the front surface of the base film 2.

The planar coils 31, 32, 33, and 34 and the planar coils 41, 42, 43, and 44 are formed by patterning a conductive material. A metal such as copper, nickel, and silver is preferred as the material for forming the planar coils 31, 32, 33, and 34 and the planar coils 41, 42, 43, and 44. Among these, copper, which is relatively inexpensive and has low electrical resistance, is particularly preferable.

The four planar coils 31, 32, 33, and 34 are fixedly attached to the front side of the base film 2, and the unshown four planar coils 41, 42, 43, and 44 are fixedly attached to the back side of the base film 2. The permanent magnets 51 and 52 are reciprocally movable in the X direction relative to the planar coils 31, 32, 41, and 42, and the permanent magnets 53 and 54 are reciprocally movable in the Y direction relative to the planar coils 33, 34, 43, and 44. As described above, image stabilization corrects camera shake by causing the correction lens 7 to displace the image of a photography subject imaged by the optical system in the X and Y directions on the imaging surface of the imaging device 80 and by causing this displacement to match camera shake occurring during the image capturing, i.e., with vibration on the imaging surface, thereby to cancel the displacement.

Figure 4:
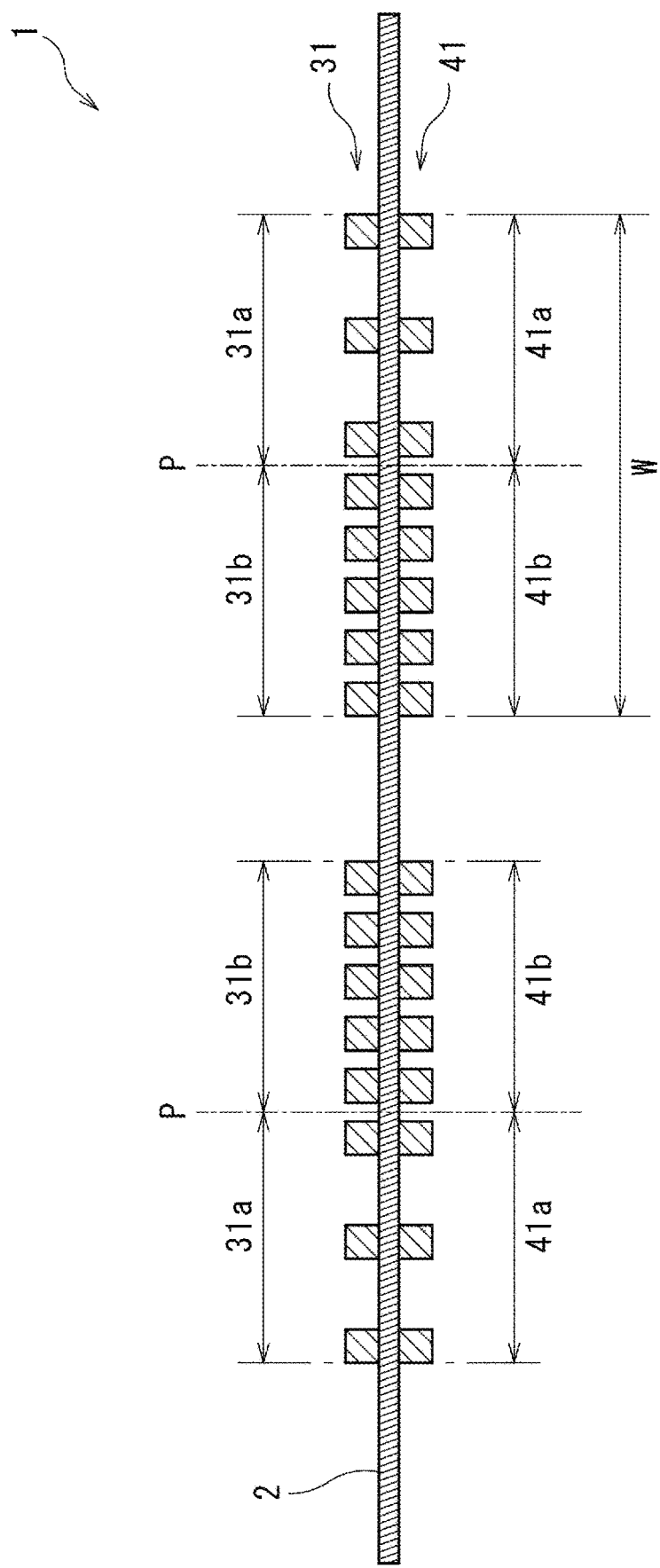
FIG. 4 is a cross-sectional view taken along the line A-A in the flexible printed circuit board of FIG. 3.

FIG. 4 is a cross-sectional view taken along the line A-A in the flexible printed circuit board 1 of FIG. 3. The planar coils 31 and 41 are such that the number of turns 31b and 41b on the inside of a center point P of a coil width W of the planar coil in a plan view is greater than the number of turns 31a and 41a on the outside. As a result, the noted flexible printed circuit board 1 can reduce the variation of Lorentz force occurring upon movement of the permanent magnets 51, 52, 53, and 54 in the peripheral area of the center portion of the coil provided in the image stabilization module 70. Accordingly, the flexible printed circuit board provides highly accurate image stabilization when the range of shake stays within the predetermined peripheral area of the center portion because a stable Lorentz force is obtained regardless of a displacement of the magnet. Further, the flexible printed circuit board can improve its maximum Lorentz force, and can thus be used for a high-performance weighty optical configuration having a plurality of lenses and the like. Moreover, Lorentz force can be maintained by a relatively small electric current, compared with a conventional optical configuration having the same weight, which enables the reduction of power consumption.

In the flexible printed circuit board 1, the lower limit of the proportion of the number of turns on the inside to the total number of turns is preferably 55%, and more preferably 60%. The fact that the proportion of the number of turns on the inside in the total number of turns is within the noted range makes it possible to reduce the variation of Lorentz force occurring upon a movement of the magnet in the image stabilization module.

The upper limit of the average thickness of the turns constituting the planar coils 31, 32, 33, and 34 and the planar coils 41, 42, 43, and 44 is preferably 100 μm, and more preferably 80 μm. Use of an average thickness exceeding the upper limit may create a risk of going against the demand for reduction in the thickness of the flexible printed circuit board 1. The lower limit of the average thickness of the turns is preferably 10 μm, and more preferably 20 μm. Use of an average thickness failing to reach the lower limit may create a risk of bringing about a large electrical resistance.

Figure 5:
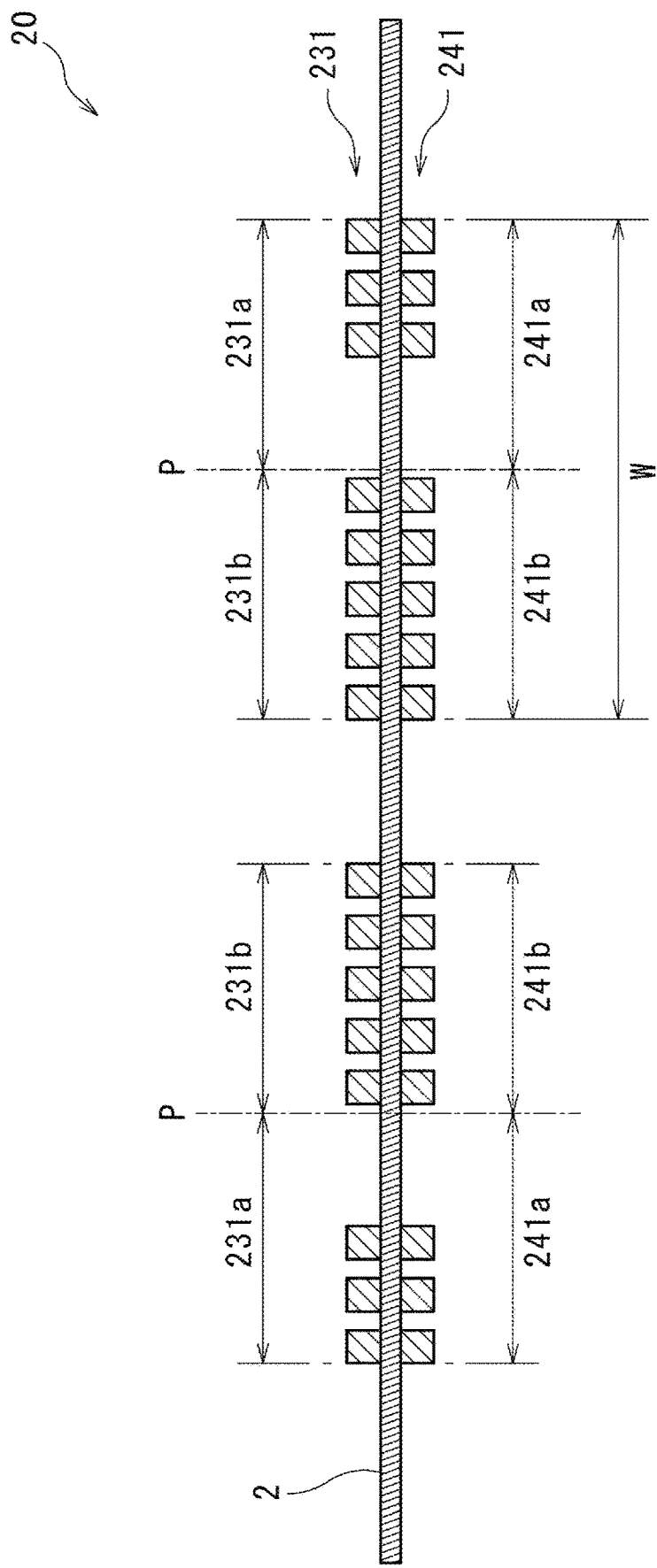
FIG. 5 is a cross-sectional view of a flexible printed circuit board according to a different embodiment.

The average intervals between adjacent turns among the turns on the inside are preferably equal. The fact that the average intervals between adjacent turns among the turns on the inside are equal makes it easy to form the planar coil. Further, as illustrated with respect to a flexible printed circuit board 20 of FIG. 5, when the average intervals between adjacent turns among turns 231b and 241b on the inside are the same, the average intervals between adjacent turns among turns 231a and 241a on the outside do not have to be the same. In the flexible printed circuit board 20 also, the planar coils 231 and 241 are such that the number of turns 231b and 241b on the inside of a center point P of a coil width W is greater than the number of turns 231a and 241a on the outside.

The lower limit of the average intervals between adjacent turns is preferably 5 μm, and more preferably 8 μm. Further, the upper limit of the average intervals is preferably 120 μm, and more preferably 110 μm. Use of average intervals failing to reach the lower limit may create a risk of making it difficult to form the turns. Conversely, use of average intervals exceeding the upper limit may create a risk of making it difficult to provide a desired winding density. It may be noted that the average interval refers to the average value of intervals between any 3 relevant points.

The lower limit of the average line width of the turns constituting the planar coils 31, 32, 33, and 34 and the planar coils 41, 42, 43, and 44 is preferably 10 μm, and more preferably 20 μm. Further, the upper limit of the average line width of the turns is preferably 125 μm, and more preferably 115 μm. Use of an average line width of the turns failing to reach the lower limit may create a risk of making it difficult to form the turns. Also, use of an average line width of the turns failing to reach the lower limit may create a risk of failing to provide the turns with sufficient thickness (i.e., the height in the thickness direction of the base film 2). Conversely, use of an average line width of the turns exceeding the upper limit may create a risk of making it difficult to provide a desired winding density. It may be noted that the average line width refers to the average value of widths at any 3 relevant points.

The lower limit of the ratio of the average line width of the turns on the outside to the average line width of the turns on the inside is preferably 1.0, and more preferably 1.2. Further, the upper limit of the ratio of average line widths is preferably 5.0, and more preferably 4.0. Use of the ratio of average line widths less than 1 may create a risk of bringing about an increase in the resistance of the planar coils 31, 32, 33, and 34 and the planar coils 41, 42, 43, and 44. Conversely, use of the ratio of average line widths exceeding 5 may create a risk of making it difficult to provide a desired winding density.

[Method of Making Flexible Printed Circuit Board]

The method of manufacturing the noted flexible printed circuit board includes laminating planar coils on at least one surface of an insulating base film. In the step of laminating planar coils, coil patterns are laminated on at least one surface of the base film. Any known methods may be used as the method of laminating coil patterns, and a subtractive method, a semi-additive method, or the like may be used. Use of the semi-additive method in particular allows coil patterns with high winding density to be efficiently obtained.

Other Embodiments

The embodiments disclosed herein should be regarded as examples only and as non-limiting in all aspects. The scope of the present disclosures is defined by the claims without being limited to the configurations of the disclosed embodiments, and is intended to include all modifications within the spirit and equivalents of the scope of the claims.

Figure 6:
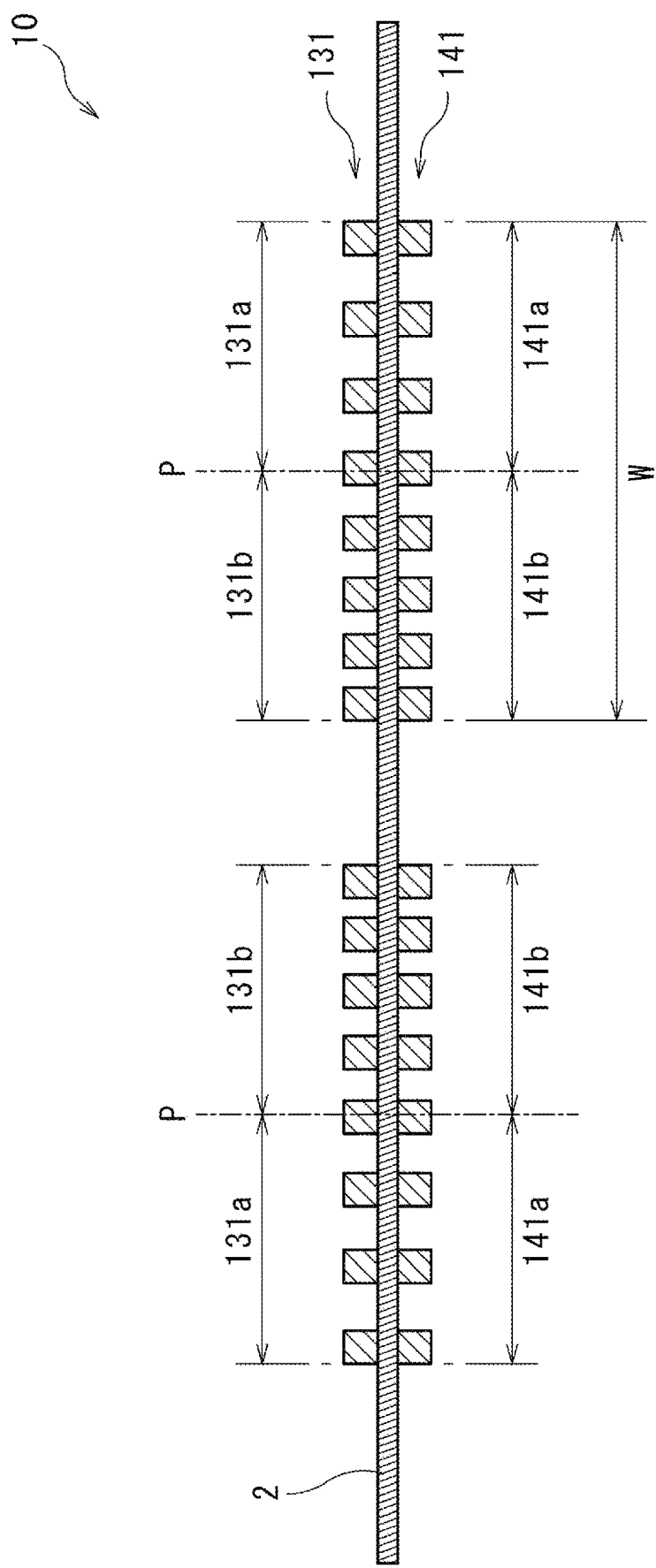
FIG. 6 is a cross-sectional view of a flexible printed circuit board according to a different embodiment.

In the above-described embodiment, the average intervals between adjacent turns among the turns on the inside are the same. Alternatively, the average intervals between adjacent turns among the turns on the inside may be different as in a flexible printed circuit board 10 of FIG. 6. The fact that the average intervals between adjacent turns among the turns on the inside are different makes it easy to adjust the density of the turns on the inside. The flexible printed circuit board 10 is such that the average intervals between adjacent turns among turns 131b and 141b on the inside are different. In the flexible printed circuit board 10 also, the planar coils 131 and 141 are such that the number of turns 131b and 141b on the inside of a center point P of a coil width W is greater than the number of turns 131a and 141a on the outside.

In the above-described embodiment, the average line width of turns on the inside and the average line width of turns on the outside are the same. Alternatively, the average line width of turns on the inside and the average line width of turns on the outside may be different as in a flexible printed circuit board 150 of FIG. 7. The fact that the average line width of turns on the inside and the average line width of turns on the outside are different allows an increase in resistance to be reduced. The flexible printed circuit board 150 is such that the average intervals between adjacent turns among turns 331b and 341b on the inside are different. The planar coils 331 and 341 of the flexible printed circuit board 150 are such that the number of turns 331b and 341b on the inside of a center point P of a coil width W is greater than the number of turns 331a and 341a on the outside. Further, the ratio of the average line width of the turns 331a and 341a on the outside to the average line width of the turns 331b and 341b on the inside is greater than or equal to 1 and less than or equal to 5.

Further, as in a flexible printed circuit board 170 of FIG. 8, the average line width of turns on the inside and the average line width of turns on the outside may be different, and, also, the average intervals between adjacent turns within the same area may be different. In the flexible printed circuit board 170, the average line width of turns 531b and 541b on the inside and the average line width of turns 531a and 541a on the outside are different, and also, the average intervals between adjacent turns are different within the inside area and different within the outside area. The planar coils 531 and 541 of the flexible printed circuit board 170 are such that the number of turns 531b and 541b on the inside of a center point P of a coil width W is greater than the number of turns 531a and 541a on the outside. Further, the ratio of the average line width of the turns 531a and 541a on the outside to the average line width of the turns 531b and 541b on the inside is greater than or equal to 1 and less than or equal to 5.

Further, as in a flexible printed circuit board 160 of FIG. 9, the average line width of adjacent turns within the same area may be different. The planar coils 431 and 441 of the flexible printed circuit board 160 are such that the number of turns 431b and 441b on the inside of a center point P of a coil width W is greater than the number of turns 431a and 441a on the outside. Further, the ratio of the average line width of the turns 431a and 441a on the outside to the average line width of the turns 431b and 441b on the inside is greater than or equal to 1 and less than or equal to 5.

DESCRIPTION OF REFERENCE SYMBOLS 1, 10, 20, 150, 160, 170 flexible printed circuit board
2 base film 6 magnet holder
7 correction lens
9 cutout
31, 32, 33, 34, 41, 42, 43, 44, 131, 141, 231, 241, 331, 341, 431, 441, 531, 541 planar coil
31a, 31b, 41a, 41b, 131a, 131b, 141a, 141b, 231a, 231b, 241a, 241b, 331a, 331b, 341a, 341b, 431a, 431b, 441a, 441b, 531a, 531b, 541a, 541b turns
51, 52, 53, 54 permanent magnet
60 image stabilization mechanism
70 image stabilization module
80 imaging device
82 substrate
91, 92, 93, 94 magnetic pole
P center point
W coil width

The invention claimed is:

1. A flexible printed circuit board comprising:
a base film having an insulating property; and
a planar coil disposed on a surface of the base film,
wherein the planar coil is formed by a strand of a conductive material patterned in a spiral shape on the surface of the base film, and a number of turns of the strand in an inner half of a coil winding area is greater than a number of turns of the strand in an outer half of the coil winding area, the coil winding area being defined as an area between an innermost turn of the strand and an outermost turn of the strand, and wherein a line width of the strand is substantially constant over the inner half of the coil winding area, and an interval between adjacent turns of the strand is substantially constant over the inner half of the coil winding area.

2. The flexible printed circuit board as claimed in claim 1, wherein a proportion of the number of turns of the strand in the inner half of the coil winding area in a total number of turns is greater than or equal to 55%.

3. The flexible printed circuit board as claimed in claim 1, wherein an average line width of the turns is greater than or equal to 10 μm and less than or equal to 125 μm.

4. The flexible printed circuit board as claimed in claim 1, wherein a ratio of an average line width of the turns of the strand in the outer half of the coil winding area to an average line width of the turns of the strand in the inner half of the coil winding area is greater than or equal to 1 and less than or equal to 5.

5. The flexible printed circuit board as claimed in claim 1, wherein average intervals between adjacent turns among the turns of the strand in the inner half of the coil winding area are equal.

6. An image stabilization module comprising
the flexible printed circuit board of claim 1; and
a permanent magnet.

* * * * *